(12) United States Patent
Kim et al.

(10) Patent No.: US 9,831,422 B2
(45) Date of Patent: Nov. 28, 2017

(54) MAGNETIC MEMORY DEVICES HAVING PERPENDICULAR MAGNETIC TUNNEL JUNCTION

(71) Applicants: Samsung Electronics Co., Ltd., Suwon-si, Gyeonggi-do (KR); International Business Machines Corporation, Armonk, NY (US)

(72) Inventors: Woojin Kim, Yongin-si (KR); Joonmyoung Lee, Anyang-si (KR); Yong Sung Park, Suwon-si (KR); Stuart S. P. Parkin, San Jose, CA (US)

(73) Assignees: SAMSUNG ELECTRONICS CO., LTD. (KR); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/919,717

(22) Filed: Oct. 21, 2015

(65) Prior Publication Data
US 2017/0117455 A1    Apr. 27, 2017

(51) Int. Cl.
  H01L 29/82   (2006.01)
  H01L 21/06   (2006.01)
  H01L 43/08   (2006.01)
  H01L 43/02   (2006.01)

(52) U.S. Cl.
  CPC .............. H01L 43/08 (2013.01); H01L 43/02 (2013.01)

(58) Field of Classification Search
  CPC ... H01L 21/76886; H01L 22/14; H01L 27/24; H01L 27/26; H01L 27/3279; H01L 27/329; H01L 45/04; H01L 2924/30101
  USPC .... 257/421, 296, 295, 368, 288; 438/3, 430, 438/765
  See application file for complete search history.

(56) References Cited

U.S. PATENT DOCUMENTS

| | | | |
|---|---|---|---|
| 6,340,533 B1 * | 1/2002 | Ueno | B32B 15/04 360/324.11 |
| 7,241,631 B2 | 7/2007 | Huai et al. | |
| 7,489,541 B2 | 2/2009 | Pakala et al. | |

(Continued)

FOREIGN PATENT DOCUMENTS

| | | |
|---|---|---|
| JP | 4693634 B2 | 6/2011 |
| JP | 4996390 B2 | 8/2012 |

(Continued)

*Primary Examiner* — Julio J Maldonado
*Assistant Examiner* — Moin Rahman
(74) *Attorney, Agent, or Firm* — Renaissance IP Law Group LLP

(57) ABSTRACT

A magnetic memory device includes a first magnetic structure on a substrate, a second magnetic structure between the substrate and the first magnetic structure, and a tunnel barrier between the first and second magnetic structures. At least one of the first and second magnetic structures includes a perpendicular magnetic layer on the tunnel barrier, and a polarization enhancement layer interposed between the tunnel barrier and the perpendicular magnetic layer. Here, the polarization enhancement layer contains cobalt, iron, and at least one of the elements of Group IV, and the polarization enhancement layer has a magnetization direction perpendicular to or substantially perpendicular to a top surface of the substrate.

18 Claims, 8 Drawing Sheets

(56) References Cited

U.S. PATENT DOCUMENTS

| | | |
|---|---|---|
| 7,502,208 B2 | 3/2009 | Hosomi |
| 8,139,324 B2 | 3/2012 | Takahashi et al. |
| 8,194,364 B2 | 6/2012 | Hara et al. |
| 8,345,390 B2 | 1/2013 | Tsuchiya et al. |
| 8,363,459 B2 | 1/2013 | Zhu et al. |
| 8,530,887 B2 | 9/2013 | Kitagawa et al. |
| 2005/0201021 A1 | 9/2005 | Hosomi |
| 2006/0141640 A1* | 6/2006 | Huai ............... B82Y 25/00 438/3 |
| 2007/0074317 A1* | 3/2007 | Pakala ............ B82Y 25/00 257/108 |
| 2007/0164336 A1 | 7/2007 | Saito et al. |
| 2008/0112214 A1* | 5/2008 | Chung ............ B82Y 25/00 365/158 |
| 2008/0176107 A1 | 7/2008 | Takahashi et al. |
| 2009/0057654 A1 | 3/2009 | Saito et al. |
| 2010/0109111 A1 | 5/2010 | Shin et al. |
| 2010/0214701 A1 | 8/2010 | Tsuchiya et al. |
| 2010/0315863 A1 | 12/2010 | Zhu et al. |
| 2011/0051295 A1 | 3/2011 | Hara et al. |
| 2011/0227179 A1 | 9/2011 | Kitagawa et al. |
| 2011/0260272 A1* | 10/2011 | Lee ............... B82Y 25/00 257/421 |
| 2012/0068285 A1* | 3/2012 | Kitagawa ........ H01F 10/3286 257/421 |
| 2012/0236631 A1* | 9/2012 | Park ............... G11C 11/16 365/158 |
| 2014/0061828 A1* | 3/2014 | Lim ............... H01L 43/08 257/421 |
| 2014/0203383 A1* | 7/2014 | Guo ............... H01L 43/10 257/421 |
| 2015/0008549 A1 | 1/2015 | Lee et al. |

FOREIGN PATENT DOCUMENTS

| | | |
|---|---|---|
| KR | 101178767 B1 | 9/2012 |
| KR | 101387583 B1 | 4/2014 |

* cited by examiner

MAGNETIC MEMORY DEVICES HAVING PERPENDICULAR MAGNETIC TUNNEL JUNCTION

BACKGROUND

Example embodiments disclosed herein relate to a magnetic memory device, and in particular, to a magnetic memory device with a perpendicular magnetic tunnel junction.

Semiconductor devices provided in electronic devices require faster operating speeds and/or lower operating voltages. Magnetic memory devices are able to satisfy such requirements. For example, a magnetic memory device can provide technical advantages, such as reduced latency and/or non-volatility. As a result, the magnetic memory devices are emerging as next-generation memory devices.

Magnetic memory devices include a magnetic tunnel junction (MTJ). An MTJ may include two magnetic layers and an insulating layer interposed therebetween. Resistance of an MTJ may vary depending on magnetization directions of the magnetic layers. For example, the resistance of an MTJ may be greater when magnetization directions of the magnetic layers are anti-parallel than when the magnetization directions are parallel. Such a difference in resistance may be used for data-storing operations of a magnetic memory device. However, more research is still needed to mass-produce highly-integrated magnetic memory devices.

SUMMARY

Example embodiments disclosed herein provide a magnetic tunnel junction (MTJ) having improved tunnel magnetoresistance (TMR) characteristics and a highly reliable magnetic memory device.

According to example embodiments disclosed herein, a magnetic memory device may include a first magnetic structure on a substrate, a second magnetic structure between the substrate and the first magnetic structure, and a tunnel barrier between the first and second magnetic structures. At least one of the first and second magnetic structures may include a perpendicular magnetic layer on the tunnel barrier, and a polarization enhancement layer interposed between the tunnel barrier and the perpendicular magnetic layer, the polarization enhancement layer comprising cobalt, iron, and at least one of the elements of Group IV, and the polarization enhancement layer may have a magnetization direction that is perpendicular to or substantially perpendicular to a top surface of the substrate.

In example embodiments, the polarization enhancement layer may be in direct contact with the tunnel barrier.

In example embodiments, the polarization enhancement layer may include carbon.

In example embodiments, the polarization enhancement layer may further include boron.

In example embodiments, the polarization enhancement layer may include CoFeC.

In example embodiments, the polarization enhancement layer may include $(Co_xFe_{100-x})_{100-z}C_z$, in which x ranges from about 0% to about 50% and z ranges from about 2% to about 8%.

In example embodiments, the polarization enhancement layer may further include boron, and the polarization enhancement layer may include CoFeCB.

In example embodiments, the polarization enhancement layer may include $(Co_xFe_{100-x})_{100-z-a}C_zB_a$, in which x ranges from about 0% to about 50% and z+a ranges from about 2% to about 8%.

In example embodiments, the tunnel barrier and the polarization enhancement layer may be in a crystalline state, and the polarization enhancement layer may have a (100) crystal plane that is parallel or substantially parallel to a (100) crystal plane of the tunnel barrier.

In example embodiments, the (100) crystal planes of the polarization enhancement layer and the tunnel barrier may be parallel or substantially parallel to the top surface of the substrate.

In example embodiments, the polarization enhancement layer may have a tetragonally-distorted crystal structure.

In example embodiments, at least one of the first and second magnetic structures may further include an exchange coupling layer between the polarization enhancement layer and the perpendicular magnetic layer to allow for exchange coupling between the polarization enhancement layer and the perpendicular magnetic layer.

In example embodiments, the perpendicular magnetic layer may include at least one magnetic layer having a magnetization direction that is fixed in a direction perpendicular or substantially perpendicular to the top surface of the substrate, and the magnetization direction of the polarization enhancement layer may be fixed in a same direction or substantially the same direction as the magnetization direction of the perpendicular magnetic layer.

In example embodiments, the magnetic memory device may further include a top electrode spaced apart from the tunnel barrier with the first magnetic structure interposed therebetween. The first magnetic structure may include the polarization enhancement layer, the exchange coupling layer, and the perpendicular magnetic layer, and the polarization enhancement layer may be in direct contact with a top surface of the tunnel barrier.

In example embodiments, the magnetic memory device may further include a bottom electrode between the substrate and the second magnetic structure. The second magnetic structure may include the polarization enhancement layer, the exchange coupling layer, the perpendicular magnetic layer, and a non-magnetic metal layer between the polarization enhancement layer and the exchange coupling layer, and the polarization enhancement layer may be in direct contact with a bottom surface of the tunnel barrier.

In example embodiments, the polarization enhancement layer may be in direct contact with a top surface of the non-magnetic metal layer.

In example embodiments, the non-magnetic metal layer may include a metal oxide.

In example embodiments, the non-magnetic metal layer may include the same material as the tunnel barrier.

In example embodiments, the perpendicular magnetic layer may include at least one magnetic layer having magnetization direction that is switchable between at least two directions perpendicular or substantially perpendicular to the top surface of the substrate, and the magnetization direction of the polarization enhancement layer may be switchable to be parallel or substantially parallel to the magnetization direction of the perpendicular magnetic layer.

In example embodiments, the magnetic memory device may further include a top electrode spaced apart from the tunnel barrier with the first magnetic structure interposed therebetween. The first magnetic structure may include the polarization enhancement layer, the exchange coupling layer, the perpendicular magnetic layer, and an upper non-magnetic layer between the perpendicular magnetic layer and the top electrode, the polarization enhancement layer may be in direct contact with a top surface of the tunnel barrier, and the upper non-magnetic layer may include the same material as the tunnel barrier.

In example embodiments, the magnetic memory device may further include a bottom electrode between the substrate and the second magnetic structure. The second magnetic structure may include the polarization enhancement layer, the exchange coupling layer, the perpendicular magnetic layer, and a non-magnetic metal layer between the polarization enhancement layer and the exchange coupling layer, and the polarization enhancement layer may be in direct contact with a bottom surface of the tunnel barrier.

According to example embodiments disclosed herein, a magnetic memory device may include a first magnetic structure on a substrate, a second magnetic structure between the substrate and the first magnetic structure, and a tunnel barrier between the first and second magnetic structures. At least one of the first and second magnetic structures may include a polarization enhancement layer in contact with a surface of the tunnel barrier, the polarization enhancement layer including cobalt, iron, and at least one of the elements of Group IV, and the polarization enhancement layer may have a magnetization direction perpendicular or substantially perpendicular to a top surface of the substrate.

In example embodiments, the polarization enhancement layer may include carbon.

In example embodiments, the polarization enhancement layer may further include boron.

In example embodiments, the polarization enhancement layer may include CoFeC.

In example embodiments, at least one of the first and second magnetic structures may further include a perpendicular magnetic layer, which is spaced apart from the tunnel barrier with the polarization enhancement layer interposed therebetween and has a magnetization direction perpendicular or substantially perpendicular to the top surface of the substrate.

In example embodiments, the magnetization direction of the polarization enhancement layer may be a same magnetization direction or substantially the same magnetization direction as that of the perpendicular magnetic layer.

In example embodiments, the polarization enhancement layer and the perpendicular magnetic layer may be configured in such a way that the magnetization directions thereof are fixed in a direction perpendicular or substantially perpendicular to the top surface of the substrate.

In example embodiments, the polarization enhancement layer and the perpendicular magnetic layer may be configured in such a way that the magnetization directions thereof are switchable.

In example embodiments, at least one of the first and second magnetic structures may further include a non-magnetic layer which is spaced apart from the tunnel barrier with the polarization enhancement layer interposed therebetween, and the non-magnetic layer may include a metal oxide.

In example embodiments, the polarization enhancement layer may be in contact with a surface of the non-magnetic layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
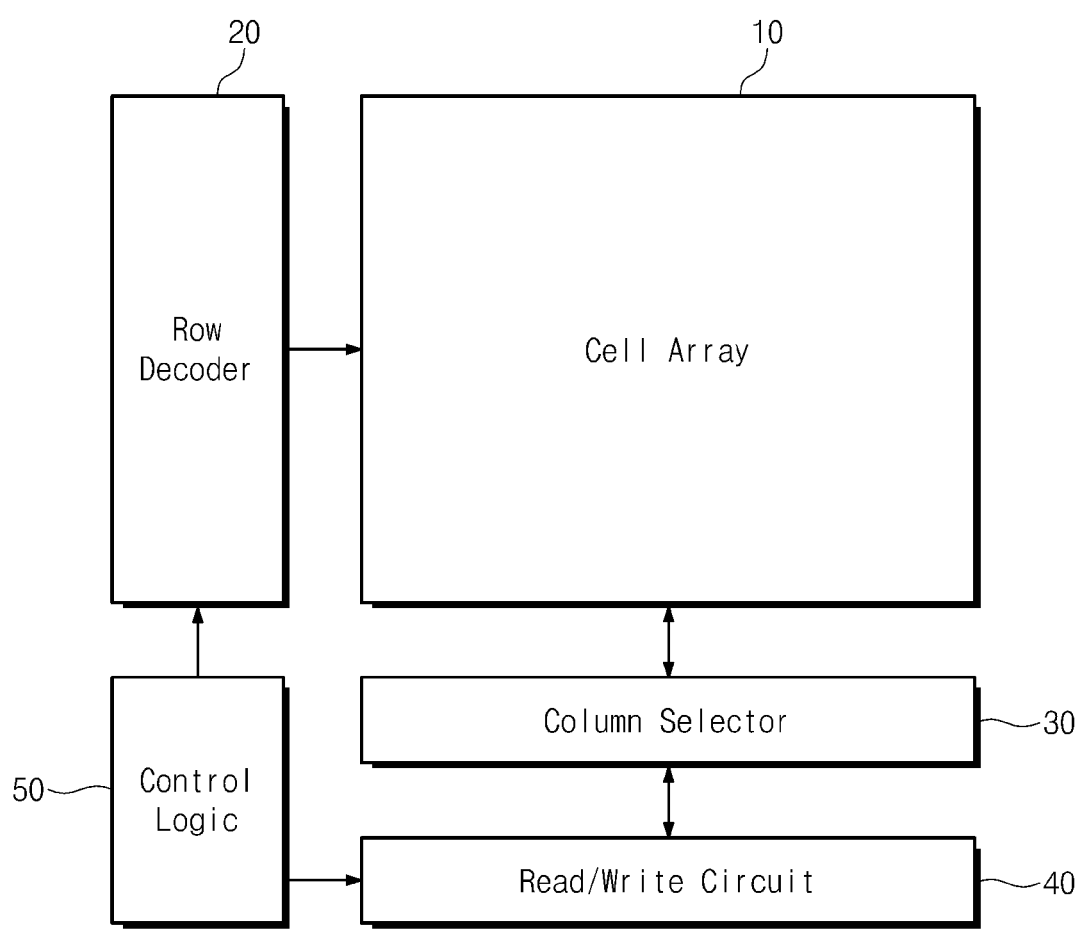
FIG. 1 is a block diagram of a magnetic memory device according to example embodiments disclosed herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first," "second," etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof. Also, as used herein, the terms such as, but not limited to, "parallel," "perpendicular," "orthogonal," "equal," "regular," "aligned," "flat" and "coplanar" should respectively be understood as "parallel or substantially parallel," "perpendicular or substantially perpendicular," "orthogonal or substantially orthogonal," "equal or substantially equal," "regular or substantially regular," "aligned or substantially aligned," "flat or substantially flat" and "coplanar or substantially coplanar."

Unless otherwise defined, all terms (including technical and scientific terms) used herein have the same meaning as commonly understood by one of ordinary skill in the art to which example embodiments disclosed herein belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of a magnetic memory device according to example embodiments disclosed herein.

Referring to FIG. 1, a magnetic memory device may include a memory cell array 10, a row decoder 20, a column selection circuit 30, a read and write circuit 40, and a control logic 50.

The memory cell array 10 may include a plurality of word lines, a plurality of bit lines, and a plurality of memory cells provided at intersections between the word and bit lines. The structure of the memory cell array 10 will be described in more detail with reference to FIG. 2.

The row decoder 20 may be connected to the memory cell array 10 through the word lines. The row decoder 20 may be configured to decode address information input received from outside of the magnetic memory device and thereby to select one of the word lines.

The column selection circuit 30 may be connected to the memory cell array 10 through the bit lines and may be configured to decode address information input received from outside of the magnetic memory device and thereby to select one of the bit lines. The bit line selected by the column selection circuit 30 may be connected to the read and write circuit 40.

The read and write circuit 40 may provide a bit line bias for accessing to the selected memory cell in response to control signals from the control logic 50. Further, the read and write circuit 40 may provide the bit line voltage to the selected bit line to write or read data to or from the memory cell.

The control logic 50 may output control signals for controlling the semiconductor memory device in response to command signals input from the outside. The control signals output from the control logic 50 may be used to control the read and write circuit 40.

Figure 2:
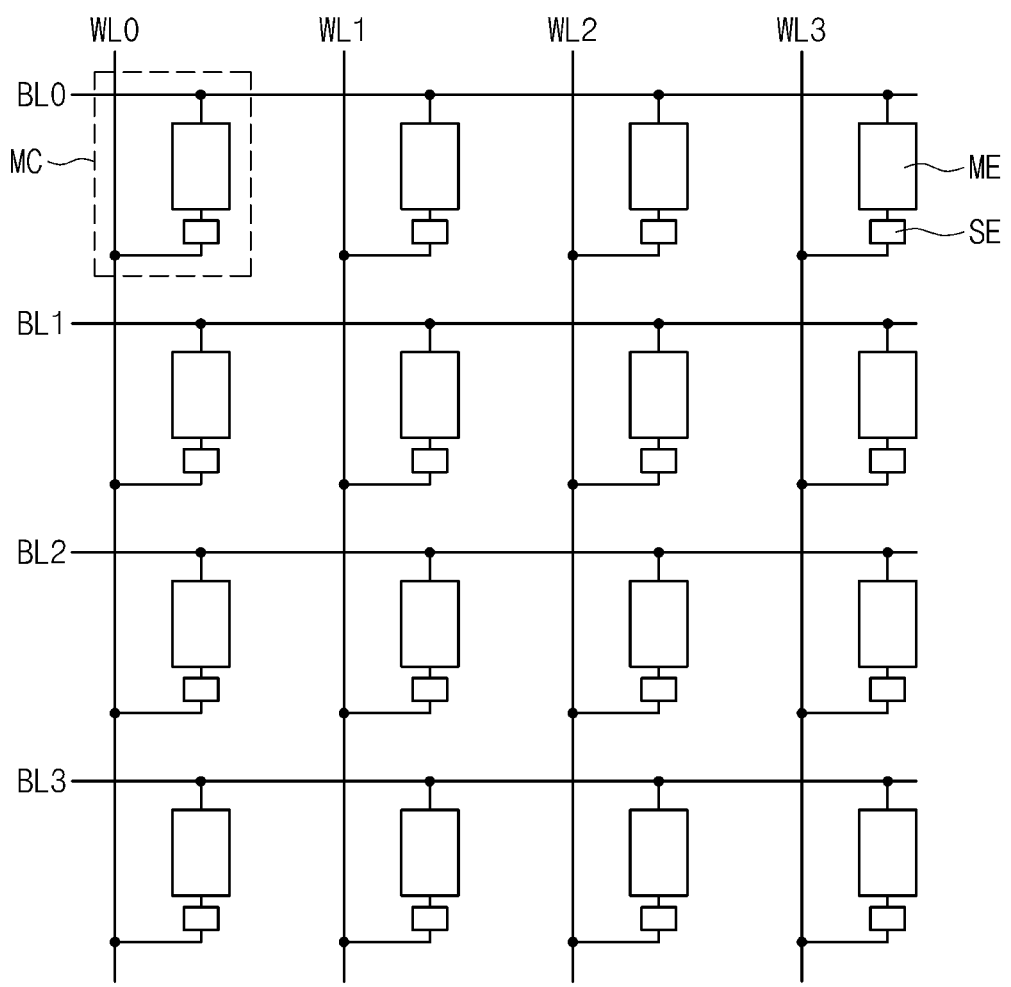
FIG. 2 is a circuit diagram illustrating a memory cell array of a magnetic memory device according to example embodiments disclosed herein.
Figure 3:
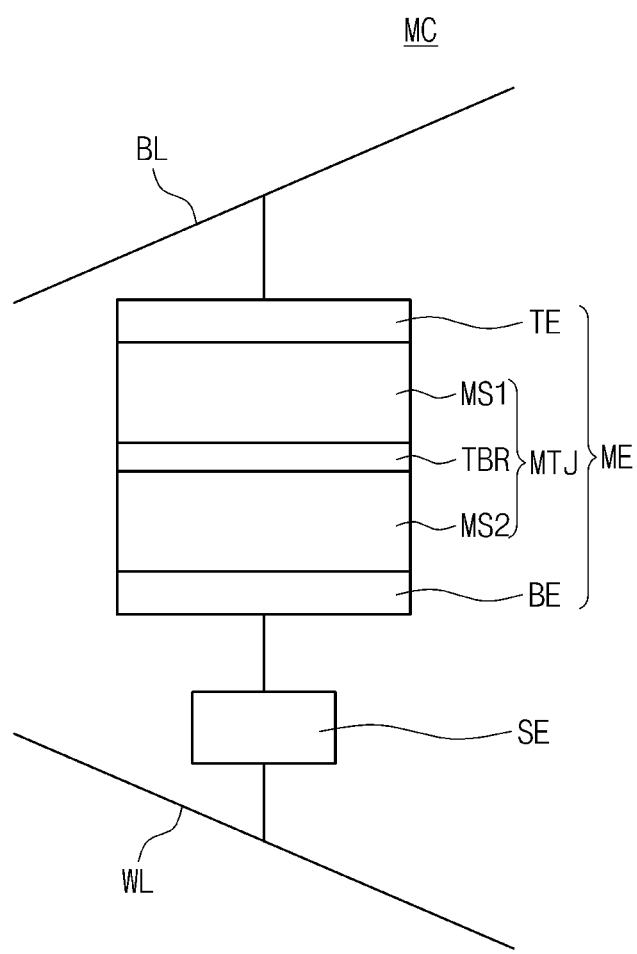
FIG. 3 is a circuit diagram illustrating a unit memory cell of a magnetic memory device according to example embodiments disclosed herein.

FIG. 2 is a circuit diagram illustrating a memory cell array of a magnetic memory device according to example embodiments disclosed herein, and FIG. 3 is a circuit diagram illustrating a unit memory cell of a magnetic memory device according to example embodiments disclosed herein.

Referring to FIG. 2, the memory cell array 10 may include a plurality of first conductive lines, a plurality of second conductive lines, and a plurality of unit memory cells MC. In example embodiments, the first conductive lines may serve as word lines WL0-WL3, and the second conductive lines may serve as bit lines BL0-BL3. The unit memory cells MC may be provided in a two-dimensional or a three-dimensional configuration. The word lines WL and the bit lines BL may be provided to cross each other, and each of the unit memory cells MC may be provided at a corresponding one of the intersections between the word lines WL and the bit lines BL. Each of the word lines WL may be connected to a plurality of the unit memory cells MC. Each of the unit memory cells MC connected to a specific one of the word lines WL may be connected to a respective bit line BL. Each of the bit lines BL may be connected to a corresponding one of the unit memory cells MC that is connected to a specific one of the word lines WL. Accordingly, the unit memory cells MC connected to the word line WL may be connected to the read and write circuit 40, described with reference to FIG. 1, through the bit lines BL.

Referring to FIG. 3, each of the unit memory cells MC may include a memory element ME and a selection element SE. The memory element ME may be provided between the bit line BL and the selection element SE, and the selection element SE may be provided between the memory element ME and the word line WL. The memory element ME may be a variable resistance device having a resistance that can be switched to one of at least two states by an electric pulse applied thereto.

In example embodiments, the memory element ME may have a layered structure having an electrical resistance that can be changed by a spin-transfer process using an electric current passing therethrough. For example, the memory element ME may have a layered structure configured to exhibit a magneto-resistance property and may include at least one ferromagnetic material and/or at least one antiferromagnetic material.

The selection element SE may be configured to selectively control a flow of an electric current passing through the memory element ME. For example, the selection element SE may be one of a diode, a pnp bipolar transistor, an npn bipolar transistor, an n-channel metal-oxide-semiconductor field effect transistor (NMOS-FET), and a PMOS-FET. In the case that the selection element SE is a three-terminal switching device (e.g., a bipolar transistor or a MOSFET), an additional interconnection line may be connected to a control electrode or gate of the selection element SE.

In detail, the memory device ME may include a first magnetic structure MS1, a second magnetic structure MS2, and a tunnel barrier TBR therebetween. The first magnetic structure MS1, the second magnetic structure MS2, and the tunnel barrier TBR may form a magnetic tunnel junction MTJ. Each of the first and second magnetic structures MS1 and MS2 may include at least one magnetic layer made of a magnetic material. The memory device ME may include a bottom electrode BE interposed between the second magnetic structure MS2 and the selection element SE and a top electrode TE interposed between the first magnetic structure MS1 and the bit line BL.

Figure 4:
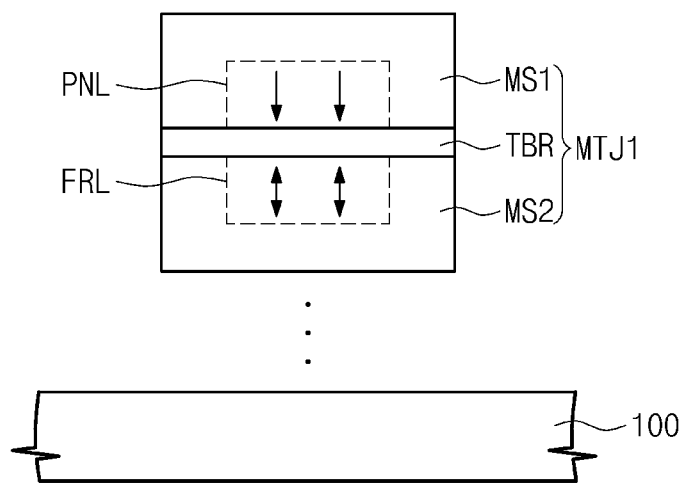
FIGS. 4 and 5 are schematic diagrams illustrating magnetic tunnel junctions according to example embodiments disclosed herein.
Figure 5:
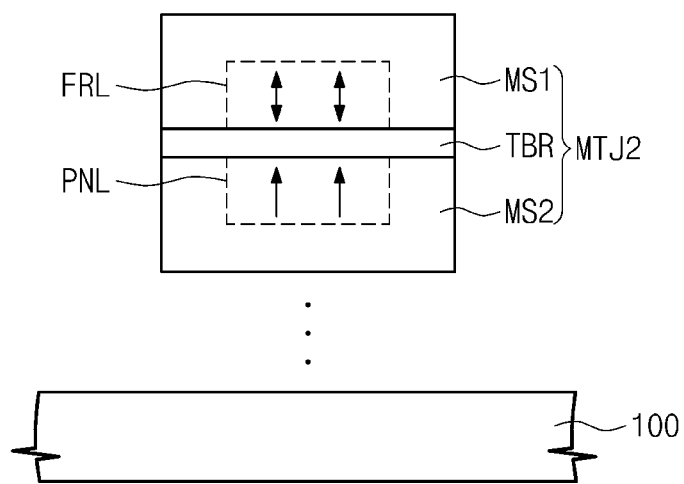

FIGS. 4 and 5 are schematic diagrams illustrating magnetic tunnel junctions according to example embodiments disclosed herein.

Referring to FIGS. 4 and 5, the magnetic tunnel junction MTJ may be provided on a substrate 100. The magnetic tunnel junction MTJ may include the first magnetic structure MS1, the second magnetic structure MS2, and the tunnel barrier TBR therebetween sequentially stacked on the substrate 100. The second magnetic structure MS2 may be provided between the substrate 100 and the tunnel barrier TBR, and the first magnetic structure MS1 may be spaced apart from the second magnetic structure MS2 with the tunnel bather TBR interposed therebetween.

One of the magnetic layers of the first and second magnetic structures MS1 and MS2 may be configured to have a fixed direction magnetization, which is not changed by an external magnetic field that is generated in a usual usage environment. In the following portion of the present specification, for convenience in description, a term "fixed or pinned layer PNL" will be used to represent a magnetic layer having such a fixed magnetization property. The other of the magnetic layers of the first and second magnetic structures MS1 and MS2 may be configured to have a variable magnetization direction, which can be switched by an external magnetic field applied thereto. Hereinafter, a term "free layer FRL" will be used to represent a magnetic layer having such a switchable magnetization property. The magnetic tunnel junction MTJ may include at least one free layer FRL and at least one fixed layer PNL separated by the tunnel barrier TBR.

The magnetic tunnel junction MTJ may have an electric resistance varying depending on magnetization directions of the free and fixed layers FRL and PNL. For example, the electric resistance of the magnetic tunnel junction MTJ may be much greater when magnetization directions of the free and fixed layers FRL and PNL are anti-parallel than when they are parallel. As a result, the electric resistance of the magnetic tunnel junction MTJ can be controlled by changing a magnetization direction of the free layer FRL, and this may be used as data-storing mechanism in the magnetic memory device according to example embodiments disclosed herein.

Each of the first and second magnetic structures MS1 and MS2 may include at least one magnetic layer having a magnetization direction that is perpendicular or substantially perpendicular to the top surface 101 of the substrate 100. In this case, according to a relative configuration between the free layer FRL and the substrate 100 and/or a forming order of the free and fixed layers FRL and PNL, the magnetic tunnel junction MTJ may be classified into the following two types.

As an example, as shown in FIG. 4, the magnetic tunnel junction MTJ may be a first-type magnetic tunnel junction MTJ1 configured in such a way that the first and second magnetic structures MS1 and MS2 include the fixed and free layers PNL and FRL, respectively. Alternatively, as shown in FIG. 5, the magnetic tunnel junction MTJ may be a second-type magnetic tunnel junction MTJ2 configured in such a way that the first and second magnetic structures MS1 and MS2 include the free and fixed layers FRL and PNL, respectively.

Figure 6:
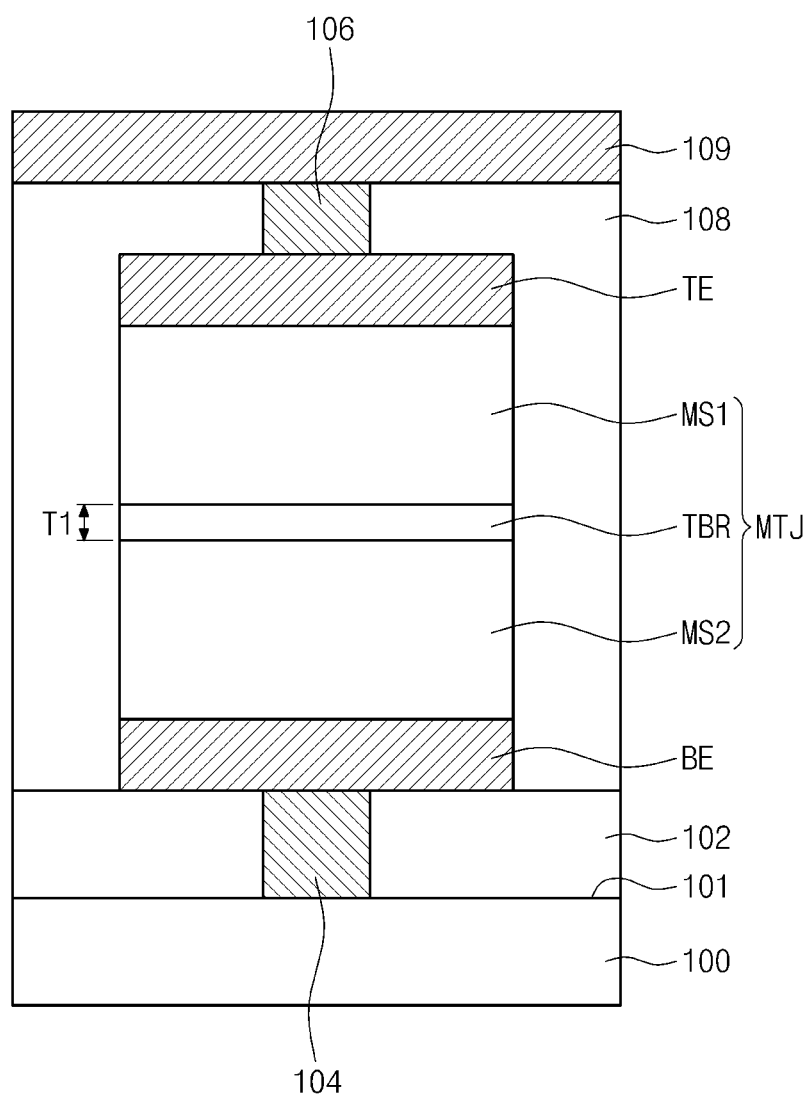
FIG. 6 is a sectional view illustrating a magnetic memory device according to example embodiments disclosed herein.

FIG. 6 is a sectional view illustrating a magnetic memory device according to example embodiments disclosed herein.

Referring to FIG. 6, a first dielectric layer 102 may be provided on a substrate 100, and a lower contact plug 104 may be provided to penetrate the first dielectric layer 102. A bottom surface of the lower contact plug 104 may be electrically connected to one of the terminals of the selection element SE described with reference to FIG. 3.

The substrate 100 may be formed from or include one of a semiconductor material, an insulating material, or a semiconductor or a conductive material covered with an insulating layer. For example, the substrate 100 may be a silicon wafer. The first dielectric layer 102 may include oxide, nitride, and/or oxynitride. The lower contact plug 104 may include a conductive material. For example, the lower contact plug 104 may include at least one conductive material, such as a doped semiconductor (e.g., doped silicon, doped germanium, or doped silicon-germanium), a metal (e.g., titanium, tantalum, or tungsten), and a conductive metal nitride (e.g., titanium nitride, tantalum nitride).

The bottom electrode BE, the magnetic tunnel junction MTJ, and the top electrode TE may be sequentially stacked on the first dielectric layer 102. The bottom electrode BE may be electrically coupled to a top surface of the lower contact plug 104. The bottom electrode BE, the magnetic tunnel junction MTJ, and the top electrode TE may be provided to have vertically-aligned sidewalls.

The bottom electrode BE may include a conductive material. As an example, the bottom electrode BE may include at least one conductive metal nitride (e.g., titanium nitride and/or tantalum nitride).

The magnetic tunnel junction MTJ may include the first magnetic structure MS1 on the bottom electrode BE, the second magnetic structure MS2 between the bottom electrode BE and the first magnetic structure MS1, and the tunnel barrier TBR between the first magnetic structure MS1 and the second magnetic structure MS2. For example, the second magnetic structure MS2 may be provided between the bottom electrode BE and the tunnel barrier TBR, and the first magnetic structure MS1 may be provided between the top electrode TE and the tunnel barrier TBR. In one embodiment, the second magnetic structure MS2, the tunnel barrier TBR and the first magnetic structure MS1 are aligned in substantially a first direction. The first and second magnetic structures MS1 and MS2 will be described in more detail with reference to FIGS. 7 through 10.

The tunnel barrier TBR may include at least one of magnesium oxide, titanium oxide, aluminum oxide, magnesium-zinc oxide, magnesium-boron oxide, titanium nitride, or vanadium nitride. For example, the tunnel barrier TBR may be a magnesium oxide layer. Alternatively, the tunnel barrier TBR may include a plurality of layers, each of which may include at least one of magnesium oxide, titanium oxide, aluminum oxide, magnesium-zinc oxide, magnesium-boron oxide, titanium nitride, or vanadium nitride. The tunnel barrier TBR may have a thickness T1 ranging from about 5 Å to about 15 Å.

The top electrode TE may include a conductive material. For example, the top electrode TE may include at least one of metals (e.g., tantalum (Ta), aluminum (Al), copper (Cu), gold (Au), silver (Ag), and titanium (Ti)) or conductive metal nitrides (e.g., tantalum nitride (TaN), titanium nitride (TiN)).

A second dielectric layer 108 may be provided on the substrate 100 to cover the bottom electrode BE, the magnetic tunnel junction MTJ, and the top electrode TE. An upper contact plug 106 may be provided to penetrate the second dielectric layer 108 and be connected to the top electrode TE. The second dielectric layer 108 may include at least one of oxide, nitride, or oxynitride, and the upper contact plug 106 may include at least one of a metal (e.g., titanium, tantalum, copper, aluminum, or tungsten) or a conductive metal nitride (e.g., titanium nitride or tantalum nitride). An interconnection line 109 may be provided on the second dielectric layer 108. The interconnection line 109 may be connected to the upper contact plug 106. The interconnection line 109 may include at least one of a metal (e.g., titanium, tantalum, copper, aluminum, or tungsten) or a conductive metal nitride (e.g., titanium nitride or tantalum nitride). In example embodiments, the interconnection line 109 may serve as a bit line of a magnetic memory device.

Figure 7:
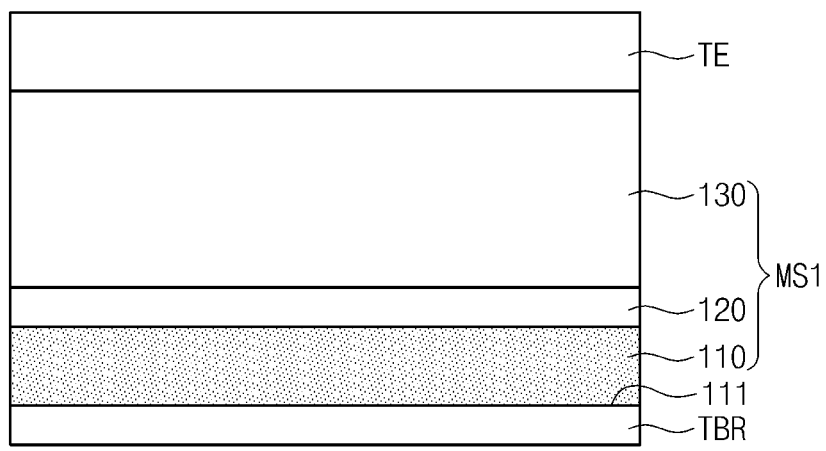
FIG. 7 is a sectional view illustrating an example of a first magnetic structure forming a magnetic tunnel junction according to example embodiments disclosed herein.

FIG. 7 is a sectional view illustrating an example of a first magnetic structure forming a magnetic tunnel junction according to example embodiments disclosed herein.

Referring to FIG. 7, the first magnetic structure MS1 may include a first polarization enhancement layer 110, a first exchange coupling layer 120, and a first perpendicular magnetic layer 130 sequentially stacked between the tunnel barrier TBR and the top electrode TE. The first magnetic structure MS1 according to the present embodiment may be a multi-layered magnetic structure that is configured to include the fixed layer PNL of the first-type magnetic tunnel junction MTJ1 described with reference to FIG. 4.

In detail, the first polarization enhancement layer 110 may be provided between the tunnel barrier TBR and the top electrode TE, and the first perpendicular magnetic layer 130 may be provided between the first polarization enhancement layer 110 and the top electrode TE. The first exchange coupling layer 120 may be provided between the first polarization enhancement layer 110 and the first perpendicular magnetic layer 130. Each of the first polarization enhancement layer 110 and the first perpendicular magnetic layer 130 may have a magnetization direction that is substantially perpendicular to the top surface 101 of the substrate 100.

The first polarization enhancement layer 110 may be provided to improve tunnel magnetoresistance (TMR) characteristics of the magnetic tunnel junction MTJ. The first polarization enhancement layer 110 may include a magnetic material. For example, the first polarization enhancement layer 110 may be formed from or include a material containing cobalt (Co), iron (Fe), and at least one of the elements of Group IV. As an example, the first polarization enhancement layer 110 may be formed from or include a material containing cobalt (Co), iron (Fe), and carbon (C). In example embodiments, the first polarization enhancement layer 110 may include cobalt-iron-carbon (CoFeC). In this case, the first polarization enhancement layer 110 may include $(Co_xFe_{100-x})_{100-z}C_z$, in which x may range from about 0% to about 50% and z ranges from about 2% to about 8%. In certain cases, the first polarization enhancement layer 110 may further contain boron (B). For example, the first polarization enhancement layer 110 may include a layer of cobalt-iron-carbon-boron (CoFeCB). In this case, the first polarization enhancement layer 110 may include $(Co_xFe_{100-x})_{100-z-a}C_zB_a$, in which x may range from about 0% to about 50% and z+a may range from about 2% to about 8%.

The first polarization enhancement layer 110 may be in direct contact with a top surface 111 of the tunnel barrier TBR. The tunnel bather TBR and the first polarization enhancement layer 110 may be provided to have a crystalline structure (e.g., polycrystalline structure). For example, the tunnel barrier TBR may have a NaCl-type type crystal structure, and the first polarization enhancement layer 110 may have a BCT (body-centered tetragonal) crystal structure having a crystal lattice similar to the NaCl-type crystal structure. The first polarization enhancement layer 110 may have a (100) crystal plane parallel or substantially parallel to a (100) crystal plane of the tunnel barrier TBR. In example embodiments, the (100) crystal planes of the first polarization enhancement layer 110 and the tunnel barrier TBR may be parallel or substantially parallel to the top surface 101 of the substrate 100. The (100) crystal planes of the first polarization enhancement layer 110 and the tunnel barrier TBR may be in contact with each other to form an interface. At the interface, improvement in lattice matching between the first polarization enhancement layer 110 and the tunnel bather TBR may allow the magnetic tunnel junction MTJ to have improved TMR characteristics.

The first polarization enhancement layer 110 may prevent magnetic elements contained in magnetic layers adjacent thereto (e.g., Pt in the first perpendicular magnetic layer 130) from being diffused into the interface between the first polarization enhancement layer 110 and the tunnel barrier TBR. For example, a subsequent thermal-treatment process may be performed on the magnetic tunnel junction MTJ, and during this thermal-treatment process, magnetic elements in magnetic layers adjacent to the first polarization enhancement layer 110 may be diffused into the interface between the first polarization enhancement layer 110 and the tunnel barrier TBR. In the case in which the first polarization enhancement layer 110 contains CoFeC, carbon C may be segregated in a grain boundary of the first polarization enhancement layer 110 during the thermal-treatment process, and this makes it possible to suppress the magnetic elements from being diffused into the interface between the first polarization enhancement layer 110 and the tunnel barrier TBR. As a result, the magnetic tunnel junction MTJ may have improved TMR characteristics.

The first polarization enhancement layer 110 may have a tetragonally-distorted crystal structure. In the case in which the first polarization enhancement layer 110 contains, for example, CoFeC, carbon coupled to CoFe may lead to tetragonal distortion of the CoFe crystal structure (for example, BCC (body-centered cubic) crystal structure). As a result, the first polarization enhancement layer 110 may have, for example, a BCT crystal structure. Further, the carbon-induced tetragonal distortion may result in improvement in perpendicular magnetic anisotropy of the first polarization enhancement layer 110.

According to general technology, in order to improve the TMR characteristics of the magnetic tunnel junction MTJ, the magnetic tunnel junction MTJ may be configured to include the tunnel bather TBR and a polarization enhancement layer, which is provided to be in contact with a surface of the tunnel barrier TBR. Here, the polarization enhancement layer may include, for example, CoFeB. When the polarization enhancement layer is deposited, at least a portion of the polarization enhancement layer may have an amorphous structure, and then, it may be transformed to a crystalline structure through a subsequent thermal-treatment process. Here, to effectively achieve such a transformation, it may be necessary to perform the thermal-treatment process at a high temperature of about 400° C. or more. However, in such a high-temperature environment, magnetic elements may be easily diffused into the polarization enhancement layer and/or into the interface between the polarization enhancement layer and the tunnel barrier TBR from the magnetic layers forming the magnetic tunnel junction MTJ, and this diffusion may lead to deterioration in TMR characteristics of the magnetic tunnel junction MTJ.

In the present embodiment, the first polarization enhancement layer 110 may be formed from or include a material containing cobalt (Co), iron (Fe), and at least one of the elements of Group IV. For example, the first polarization enhancement layer 110 may include cobalt-iron-carbon (CoFeC). At the time that the first polarization enhancement layer 110 is deposited, the first polarization enhancement layer 110 may have a crystalline structure including a (100) crystal plane parallel or substantially parallel to a (100) crystal plane of the tunnel barrier TBR. Thus, even when a subsequent thermal-treatment process is performed on the magnetic tunnel junction MTJ at a low temperature of 300° C. or less, it is easy to maintain the (100) crystal plane of the first polarization enhancement layer 110 to be parallel or substantially parallel to the (100) crystal plane of the tunnel barrier TBR. The (100) crystal planes of the first polarization enhancement layer 110 and the tunnel barrier TBR may be in contact with each other to form an interface, and at the interface, good lattice matching between the first polarization enhancement layer 110 and the tunnel barrier TBR may allow the magnetic tunnel junction MTJ to have improved TMR characteristics.

In the case in which the first polarization enhancement layer 110 contains CoFeC, carbon C may be segregated in a grain boundary of the first polarization enhancement layer 110 during the thermal-treatment process. This segregation may make it possible to suppress the magnetic elements in the magnetic layers forming the magnetic tunnel junction MTJ from being diffused into the interface between the first polarization enhancement layer and the tunnel barrier TBR during the thermal-treatment process, and thus, the magnetic tunnel junction MTJ may have improved TMR characteristics.

Further, in the case in which the first polarization enhancement layer 110 contains CoFeC, the presence of carbon may allow the first polarization enhancement layer 110 to have a tetragonal-distorted crystal structure, and this makes it possible to improve a perpendicular magnetic anisotropy property of the first polarization enhancement layer 110.

As a result, it is possible to realize a magnetic memory device with improved reliability.

The first exchange coupling layer 120 may include a non-magnetic metal material. For example, the non-magnetic metal material may be one of Hf, Zr, Ti, Ta, and any alloy thereof. The first exchange coupling layer 120 may allow for an exchange coupling between the first polarization enhancement layer 110 and the first perpendicular magnetic layer 130, and thus, the first polarization enhancement layer 110 may have the same magnetization direction or substantially the same magnetization direction as that of the first perpendicular magnetic layer 130. In the present embodiment, each of the first polarization enhancement layer 110 and the first perpendicular magnetic layer 130 may have a fixed magnetization direction.

The first perpendicular magnetic layer 130 may be formed from a magnetic material exhibiting an intrinsic perpendicular magnetization property (hereinafter, referred as to a "perpendicular magnetization material"). Here, the term "intrinsic perpendicular magnetization property," as used herein, means that a magnetization direction of a magnetic layer is oriented parallel or substantially parallel to its thickness direction or perpendicular or substantially perpendicular to its main surface, when there is no external magnetic field applied thereto. For example, in the case that a magnetic layer with the perpendicular magnetization property is formed on a substrate, a magnetization direction of the magnetic layer may be perpendicular or substantially perpendicular to a top surface of the substrate.

The intrinsic perpendicular magnetization property may be realized by a single-layered or multi-layered structure including at least one of cobalt-containing perpendicular magnetization materials. As an example, the first perpendicular magnetic layer 130 may be a single-layered or multi-layered structure including a cobalt-platinum alloy or cobalt-platinum alloys added with an element X, in which the element X is at least one of boron, ruthenium, chromium, tantalum, or oxide. As another example, the first perpendicular magnetic layer 130 may be provided in the form of a multi-layered structure including cobalt-containing layers and noble metal layers alternately stacked one on top of the other. The cobalt-containing layers may be formed from one of cobalt, cobalt iron, cobalt nickel, and cobalt chromium, and the noble metal layers may be formed from one of platinum and palladium. In other examples, the first perpendicular magnetic layer 130 may be provided in the form of a multi-layered structure including at least one of the above materials.

In order to provide better understanding of embodiments disclosed herein, some examples of intrinsic perpendicular magnetization materials for the first perpendicular magnetic layer 130 are described, but example embodiments may not be limited thereto. For example, the first perpendicular magnetic layer 130 may include at least one of: a) CoFeTb, in which the relative content of Tb is 10% or more; b) CoFeGd, in which the relative content of Gd is 10% or more; c) CoFeDy; d) FePt with an L10 structure; e) FePd with an L10 structure; 0 CoPd with an L10 structure; g) CoPt with an L10 or L11 structure; h) CoPt with the hexagonal close packing (HCP) structure; i) alloys containing at least one of materials presented in items of a) to h); and/or j) a multi-layered structure including magnetic and non-magnetic layers alternatingly stacked. The multi-layered structure including the alternatingly-stacked magnetic and non-magnetic layers may include at least one of (Co/Pt)n, (CoFe/Pt)n, (CoFe/Pd)n, (CoP)n, (Co/Ni)n, (CoNi/Pt)n, (CoCr/Pt)n, and/or (CoCr/Pd)n, in which the subscript n denotes the stacking number. In certain embodiments, the first perpendicular magnetic layer 130 may further include a cobalt layer or a cobalt-rich layer disposed to be in contact with the first exchange coupling layer 120.

Figure 8:
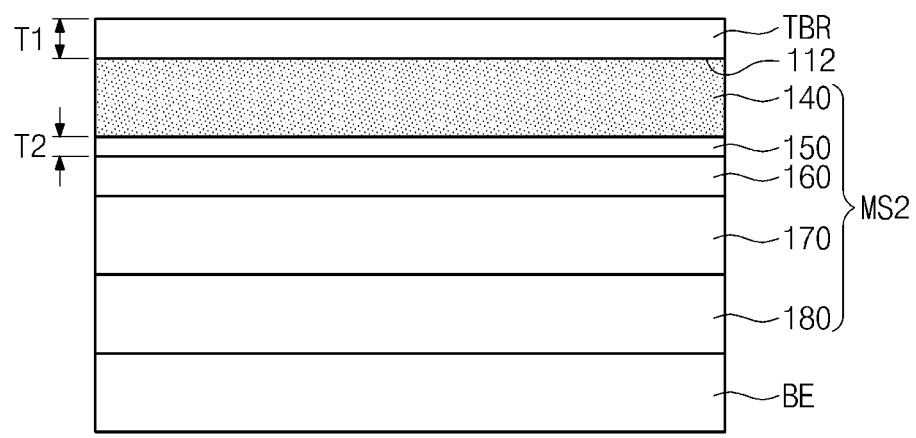
FIG. 8 is a sectional view illustrating an example of a second magnetic structure forming a magnetic tunnel junction according to example embodiments disclosed herein.

FIG. 8 is a sectional view illustrating an example of a second magnetic structure forming a magnetic tunnel junction according to example embodiments disclosed herein.

Referring to FIG. 8, the second magnetic structure MS2 may include a second polarization enhancement layer 140, a second exchange coupling layer 160, and a second perpendicular magnetic layer 170 sequentially stacked between the tunnel barrier TBR and the bottom electrode BE. The second magnetic structure MS2 may further include a seed layer 180 between the bottom electrode BE and the second perpendicular magnetic layer 170 and a non-magnetic metal layer 150 between the second polarization enhancement layer 140 and the second exchange coupling layer 160. The second magnetic structure MS2 according to the present embodiment may be a multi-layered magnetic structure that is configured to include the free layer FRL of the first-type magnetic tunnel junction MTJ1 described with reference to FIG. 4.

In detail, the second polarization enhancement layer 140 may be disposed between the tunnel bather TBR and the bottom electrode BE, and the second perpendicular magnetic layer 170 may be disposed between the second polarization enhancement layer 140 and the bottom electrode BE. The second exchange coupling layer 160 may be disposed between the second polarization enhancement layer 140 and the second perpendicular magnetic layer 170. The seed layer 180 may be disposed between the second perpendicular magnetic layer 170 and the bottom electrode BE, and the non-magnetic metal layer 150 may be disposed between the second polarization enhancement layer 140 and the second exchange coupling layer 160. Each of the second polarization enhancement layer 140 and the second perpendicular magnetic layer 170 may have a magnetization direction that is perpendicular or substantially perpendicular to the top surface 101 of the substrate 100.

The second polarization enhancement layer 140 may be provided to improve tunnel magnetoresistance (TMR) characteristics of the magnetic tunnel junction MTJ. The second polarization enhancement layer 140 may include a magnetic material. As an example, the second polarization enhancement layer 140 may be formed from or include a material containing cobalt (Co), iron (Fe), and at least one of the elements of Group IV. The second polarization enhancement layer 140 may include the same material as the first polarization enhancement layer 110 described with reference to FIG. 7. For example, the second polarization enhancement layer 140 may include cobalt-iron-carbon (CoFeC). In this case, the second polarization enhancement layer 140 may include $(Co_xFe_{100-x})_{100-z}C_z$, in which x may range from about 0% to about 50% and z ranges from about 2% to about 8%. In certain cases, the second polarization enhancement layer 140 may further include boron (B). For example, the second polarization enhancement layer 140 may include a layer of cobalt-iron-carbon-boron (CoFeCB). In this case, the second polarization enhancement layer 140 may include $(Co_xFe_{100-x})_{100-z-a}C_zB_a$, in which x may range from about 0% to about 50% and z+a may range from about 2% to about 8%.

The second polarization enhancement layer 140 may be in direct contact with a bottom surface 112 of the tunnel barrier TBR and with a top surface of the non-magnetic metal layer 150. As an example, the tunnel barrier TBR, the second polarization enhancement layer 140, and the non-magnetic metal layer 150 may have a crystalline structure (e.g., a polycrystalline structure). For example, each of the tunnel barrier TBR and the non-magnetic metal layer 150 may have a NaCl-type crystal structure, and the second polarization enhancement layer 140 may have a BCT (body-centered tetragonal) crystal structure having a crystal lattice similar to the NaCl-type crystal structure. The second polarization enhancement layer 140 may have a (100) crystal plane, which may be parallel or substantially parallel to the (100) crystal planes of the non-magnetic metal layer 150 and the tunnel barrier TBR. In example embodiments, the (100) crystal planes of the second polarization enhancement layer 140, the tunnel barrier TBR, and the non-magnetic metal layer 150 may be parallel or substantially parallel to the top surface of the substrate 100. The (100) crystal planes of the second polarization enhancement layer 140 and the tunnel barrier TBR may be in contact with each other to form an interface, and at the interface, good lattice matching between the second polarization enhancement layer 140 and the tunnel barrier TBR may allow the magnetic tunnel junction MTJ to have improved TMR characteristics.

The second polarization enhancement layer 140 may prevent or suppress magnetic elements contained in magnetic layers adjacent thereto (e.g., Pt in the second perpendicular magnetic layer 170) to being diffused into the interface between the second polarization enhancement layer 140 and the tunnel barrier TBR. For example, when a subsequent thermal-treatment process is performed on the magnetic tunnel junction MTJ, magnetic elements in magnetic layers adjacent to the second polarization enhancement layer 140 may be diffused into the interface between the second polarization enhancement layer 140 and the tunnel barrier TBR. In the case in which the second polarization enhancement layer 140 contains CoFeC, carbon C may be segregated in a grain boundary of the second polarization enhancement layer 140 during the thermal-treatment process, and this makes it possible to suppress the magnetic elements from being diffused into the interface between the second polarization enhancement layer 140 and the tunnel barrier TBR. As a result, the magnetic tunnel junction MTJ may have improved TMR characteristics.

The second polarization enhancement layer 140 may have a tetragonally-distorted crystal structure. In the case in which the second polarization enhancement layer 140 contains, for example, CoFeC, carbon coupled to CoFe may lead to tetragonal distortion of the CoFe crystal structure (for example, BCC crystal structure). As a result, the second polarization enhancement layer 140 may have, for example, a BCT crystal structure. Further, the carbon-induced tetragonal distortion may result in improvement in perpendicular magnetic anisotropy of the second polarization enhancement layer 140.

The presence of the non-magnetic metal layer 150 may facilitate the crystal growth of the second polarization enhancement layer 140. For example, the non-magnetic metal layer 150 may have a (100) crystal plane that is parallel or substantially parallel to the top surface 101 of the substrate 100. In the case in which the second polarization enhancement layer 140 is deposited on the top surface of the non-magnetic metal layer 150, the second polarization enhancement layer 140 may be deposited to have a crystalline structure, in which a (100) crystal plane is formed to be parallel or substantially parallel to the (100) crystal plane of the non-magnetic metal layer 150. The tunnel barrier TBR may also have a (100) crystal plane that is parallel or substantially parallel to the top surface 101 of the substrate 100. Thus, even when a subsequent thermal treatment process is performed on the magnetic tunnel junction MTJ at a low temperature of 300° C. or less, it is easy to maintain the (100) crystal plane of the second polarization enhancement layer 140 to be parallel or substantially parallel to the (100) crystal plane of the tunnel barrier TBR.

The non-magnetic metal layer 150 may include at least one of magnesium oxide, titanium oxide, aluminum oxide, magnesium-zinc oxide, magnesium-boron oxide, titanium nitride, or vanadium nitride. The non-magnetic metal layer 150 may include the same material as the tunnel barrier TBR. As an example, the non-magnetic metal layer 150 may be a magnesium oxide layer. In example embodiments, the non-magnetic metal layer 150 may have a thickness T2 smaller than the thickness T1 of the tunnel barrier TBR.

The second exchange coupling layer 160 may include a non-magnetic metal material. For example, the non-magnetic metal material may be one of Hf, Zr, Ti, Ta, and any alloy thereof. The second exchange coupling layer 160 may allow for an exchange coupling between the second polarization enhancement layer 140 and the second perpendicular magnetic layer 170, and thus, the second polarization enhancement layer 140 may exhibit a perpendicular magnetization property having a direction that is parallel or substantially parallel to a magnetization direction of the second perpendicular magnetic layer 170. In the present embodiment, each of the second polarization enhancement layer 140 and the second perpendicular magnetic layer 170 may have a switchable magnetization direction. In example embodiments, the second exchange coupling layer 160 may be omitted.

The second perpendicular magnetic layer 170 may be formed from a magnetic material exhibiting an intrinsic perpendicular magnetization property (hereinafter, referred as to a "perpendicular magnetization material"). The intrinsic perpendicular magnetization property may be realized by a single-layered or multi-layered structure including at least one of cobalt-containing perpendicular magnetization materials. As an example, the second perpendicular magnetic layer 170 may be a single-layered or multi-layered structure including a cobalt-platinum alloy or cobalt-platinum alloys added with an element X, in which the element X is at least one of boron, ruthenium, chromium, tantalum, or oxide. As another example, the second perpendicular magnetic layer 170 may be provided in the form of a multi-layered structure including cobalt-containing layers and noble metal layers alternately stacked one on top of the other. The cobalt-containing layers may be formed from one of cobalt, cobalt iron, cobalt nickel, and cobalt chromium, and the noble metal layers may be formed from one of platinum and palladium. In other examples, the second perpendicular magnetic layer 170 may be provided in the form of a multi-layered structure including at least one of the above materials.

The seed layer 180 may include a material facilitating or expediting crystal growth of the magnetic layers forming the magnetic tunnel junction MTJ. In example embodiments, the seed layer 180 may include metal atoms forming a hexagonal close packed (HCP) lattice. For example, the seed layer 180 may include at least one of ruthenium (Ru), titanium (Ti), or tantalum (Ta). In other example embodiments, the seed layer 180 may include metal atoms forming a face-centered cubic (FCC) lattice. For example, the seed layer 180 may include at least one of platinum (Pt), palladium (Pd), gold (Au), silver (Ag), copper (Cu), or aluminum (Al). The seed layer 180 may include a single layer or a plurality of layers, at least one of which has a different crystal structure from the others.

Figure 9:
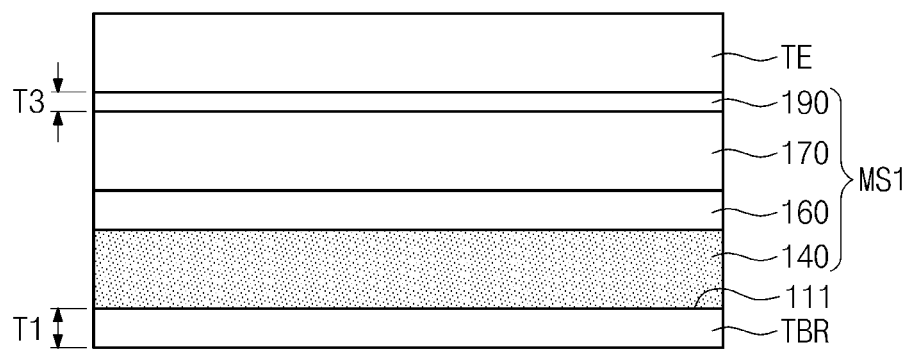
FIG. 9 is a sectional view illustrating another example of the first magnetic structure forming a magnetic tunnel junction according to example embodiments disclosed herein.

FIG. 9 is a sectional view illustrating another example of the first magnetic structure forming a magnetic tunnel junction according to example embodiments disclosed herein.

Referring to FIG. 9, the first magnetic structure MS1 may include the second polarization enhancement layer 140, the second exchange coupling layer 160, and the second perpendicular magnetic layer 170 sequentially stacked between the tunnel barrier TBR and the top electrode TE. The first magnetic structure MS1 may further include an upper non-magnetic layer 190 between the top electrode TE and the second perpendicular magnetic layer 170. The first magnetic structure MS1 according to the present embodiment may be a multi-layered magnetic structure that is configured to include the free layer FRL of the second-type magnetic tunnel junction MTJ2 described with reference to FIG. 5.

In detail, the second polarization enhancement layer 140 may be disposed between the tunnel barrier TBR and the top electrode TE, and the second perpendicular magnetic layer 170 may be disposed between the second polarization enhancement layer 140 and the top electrode TE. The second exchange coupling layer 160 may be disposed between the second polarization enhancement layer 140 and the second perpendicular magnetic layer 170. The upper non-magnetic layer 190 may be disposed between the top electrode TE and the second perpendicular magnetic layer 170. Each of the second polarization enhancement layer 140 and the second perpendicular magnetic layer 170 may have a magnetization direction that is substantially perpendicular to the top surface 101 of the substrate 100.

The second polarization enhancement layer 140 may be in direct contact with the top surface 111 of the tunnel bather TBR. The tunnel bather TBR and the second polarization enhancement layer 140 may be in a crystalline (e.g., polycrystalline) state. For example, the tunnel bather TBR may have a NaCl-type crystal structure, and the second polarization enhancement layer 140 may have a BCT crystal structure. The second polarization enhancement layer 140 may have a (100) crystal plane that is parallel or substantially parallel to the (100) crystal plane of the tunnel barrier TBR. In example embodiments, the (100) crystal planes of the second polarization enhancement layer 140 and the tunnel barrier TBR may be parallel or substantially parallel to the top surface of the substrate 100.

The second exchange coupling layer 160 may allow for an exchange coupling between the second polarization enhancement layer 140 and the second perpendicular magnetic layer 170, and thus, the second polarization enhancement layer 140 may exhibit a perpendicular magnetization property having a direction that is parallel or substantially parallel to a magnetization direction of the second perpendicular magnetic layer 170. In the present embodiment, each of the second polarization enhancement layer 140 and the second perpendicular magnetic layer 170 may have a switchable magnetization direction. In example embodiments, the second exchange coupling layer 160 may be omitted.

The second polarization enhancement layer 140, the second exchange coupling layer 160, and the second perpendicular magnetic layer 170 may be provided to have substantially the same features as those of the second polarization enhancement layer 140, the second exchange coupling layer 160, and the second perpendicular magnetic layer 170 described with reference to FIG. 8, except for a difference in position, and thus, a detailed description will be omitted.

In the present embodiment, the upper non-magnetic layer 190 may help the second perpendicular magnetic layer 170 to have magnetization perpendicular to the top surface of the substrate 100. The upper non-magnetic layer 190 may include at least one of magnesium oxide, titanium oxide, aluminum oxide, magnesium-zinc oxide, magnesium-boron oxide, titanium nitride, or vanadium nitride. The upper non-magnetic layer 190 may include the same material as the tunnel barrier TBR. As an example, the upper non-magnetic layer 190 may be a magnesium oxide layer. The upper non-magnetic layer 190 may have a thickness T3 that is less than the thickness T1 of the tunnel barrier TBR.

Figure 10:
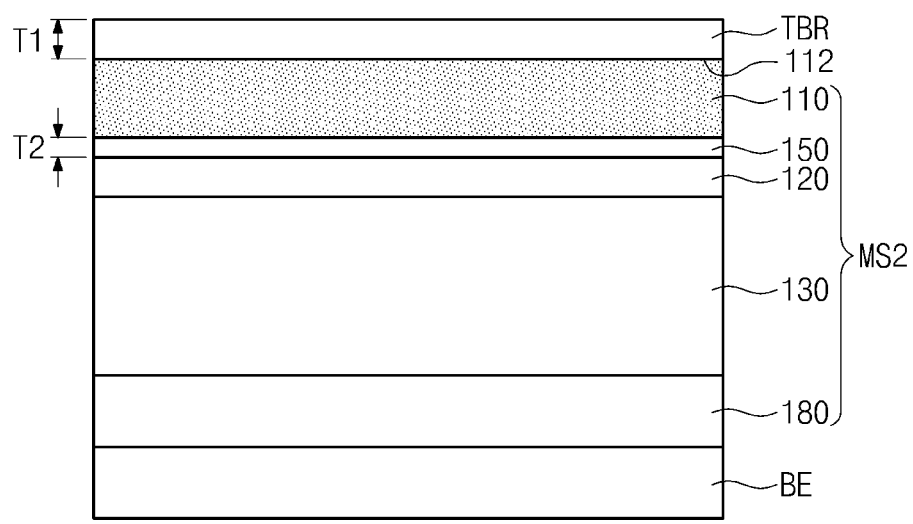
FIG. 10 is a sectional view illustrating another example of the second magnetic structure forming a magnetic tunnel junction according to example embodiments disclosed herein.

FIG. 10 is a sectional view illustrating another example of the second magnetic structure forming a magnetic tunnel junction according to example embodiments disclosed herein.

Referring to FIG. 10, the second magnetic structure MS2 may include the first polarization enhancement layer 110, the first exchange coupling layer 120, and the first perpendicular magnetic layer 130 sequentially stacked between the tunnel barrier TBR and the bottom electrode BE. The second magnetic structure MS2 may further include the seed layer 180 between the bottom electrode BE and the first perpendicular magnetic layer 130 and the non-magnetic metal layer 150 between the first polarization enhancement layer 110 and the first exchange coupling layer 120. The second magnetic structure MS2 according to the present embodiment may be a multi-layered magnetic structure that is configured to include the fixed layer PNL of the second-type magnetic tunnel junction MTJ2 described with reference to FIG. 5.

In detail, the first polarization enhancement layer 110 may be disposed between the tunnel barrier TBR and the bottom electrode BE, and the first perpendicular magnetic layer 130 may be disposed between the first polarization enhancement layer 110 and the bottom electrode BE. The first exchange coupling layer 120 may be disposed between the first polarization enhancement layer 110 and the first perpendicular magnetic layer 130, and the non-magnetic metal layer 150 may be disposed between the first polarization enhancement layer 110 and the first exchange coupling layer 120. The seed layer 180 may be disposed between the bottom electrode BE and the first perpendicular magnetic layer 130. Each of the first polarization enhancement layer 110 and the first perpendicular magnetic layer 130 may have a magnetization direction that is perpendicular or substantially perpendicular to the top surface 101 of the substrate 100.

The first polarization enhancement layer 110 may be in direct contact with a bottom surface 112 of the tunnel barrier TBR and with the top surface of the non-magnetic metal layer 150. The tunnel barrier TBR, the first polarization enhancement layer 110, and the non-magnetic metal layer 150 may have a crystalline structure (e.g., a polycrystalline structure). For example, each of the tunnel barrier TBR and the non-magnetic metal layer 150 may have a NaCl-type crystal structure, and the first polarization enhancement layer 110 may have a BCT crystal structure. The first polarization enhancement layer 110 may have a (100) crystal plane, which may be parallel or substantially parallel to the (100) crystal planes of the non-magnetic metal layer 150 and the tunnel barrier TBR. In example embodiments, the (100) crystal planes of the first polarization enhancement layer 110, the tunnel barrier TBR, and the non-magnetic metal layer 150 may be substantially parallel or substantially parallel to the top surface 101 of the substrate 100.

The presence of the non-magnetic metal layer 150 may facilitate the crystal growth of the first polarization enhancement layer 110. For example, the non-magnetic metal layer 150 may have a (100) crystal plane that is substantially parallel or substantially parallel to the top surface of the substrate 100. In the case in which the first polarization enhancement layer 110 is deposited on the top surface of the non-magnetic metal layer 150, the first polarization enhancement layer 110 may be deposited to have a crystalline structure, in which a (100) crystal plane is formed to be parallel or substantially parallel to the (100) crystal plane of the non-magnetic metal layer 150. The tunnel barrier TBR may also have a (100) crystal plane that is substantially parallel or substantially parallel to the top surface of the substrate 100. Thus, even when a subsequent thermal treatment process is performed on the magnetic tunnel junction MTJ at a low temperature of 300° C. or less, it is easy to maintain the (100) crystal plane of the first polarization enhancement layer 110 to be parallel or substantially parallel to the (100) crystal plane of the tunnel barrier TBR. The non-magnetic metal layer 150 may have a thickness T2 that is less than the thickness T1 of the tunnel barrier TBR.

The first exchange coupling layer 120 may allow for an exchange coupling between the first polarization enhancement layer 110 and the first perpendicular magnetic layer 130, and thus, the first polarization enhancement layer 110 may have the same magnetization direction or substantially the same magnetization direction as that of the first perpendicular magnetic layer 130. In the present embodiment, each of the first polarization enhancement layer 110 and the first perpendicular magnetic layer 130 may have a fixed magnetization direction.

The first polarization enhancement layer 110, the first exchange coupling layer 120, and the first perpendicular magnetic layer 130 may be provided to have substantially the same features as those of the first polarization enhancement layer 110, the first exchange coupling layer 120, and the first perpendicular magnetic layer 130 described with reference to FIG. 7, except for a difference in position, and thus, a detailed description will be omitted. Further, the non-magnetic metal layer 150 and the seed layer 180 may be provided to have substantially the same features as those of the non-magnetic metal layer 150 and the seed layer 180 described with reference to FIG. 8, except for a difference in position.

According to example embodiments disclosed herein, the magnetic tunnel junction may include the polarization enhancement layer in contact with a surface of the tunnel barrier. The polarization enhancement layer may be formed from or include a material containing cobalt (Co), iron (Fe), and at least one of the elements of Group IV.

At the time when the polarization enhancement layer is deposited, the polarization enhancement layer may have a crystalline structure including a (100) crystal plane parallel or substantially parallel to a (100) crystal plane of the tunnel barrier. Thus, even when a subsequent thermal-treatment process is performed on the magnetic tunnel junction at a low temperature of 300° C. or less, it is easy to maintain the (100) crystal plane of the polarization enhancement layer to be parallel or substantially parallel to the (100) crystal plane of the tunnel barrier. The (100) crystal planes of the polarization enhancement layer and the tunnel barrier may be in contact with each other to form an interface, and at the interface, good lattice matching between the polarization enhancement layer and the tunnel barrier may allow the magnetic tunnel junction to have improved TMR characteristics.

During the thermal-treatment process, the at least one of the elements of Group IV contained in the polarization enhancement layer may be segregated in a grain boundary of the polarization enhancement layer. This segregation may suppress the magnetic elements in magnetic layers forming the magnetic tunnel junction from being diffused into the interface between the polarization enhancement layer and the tunnel barrier during the thermal treatment process, and thus, the magnetic tunnel junction may have improved TMR characteristics.

In addition, the presence of the at least one of the elements of Group IV may allow the polarization enhancement layer to have a tetragonally-distorted crystal structure. Thus, the polarization enhancement layer may have an improved perpendicular magnetic anisotropy property.

As a result, it is possible to realize a magnetic memory device with improved reliability.

Figure 11:
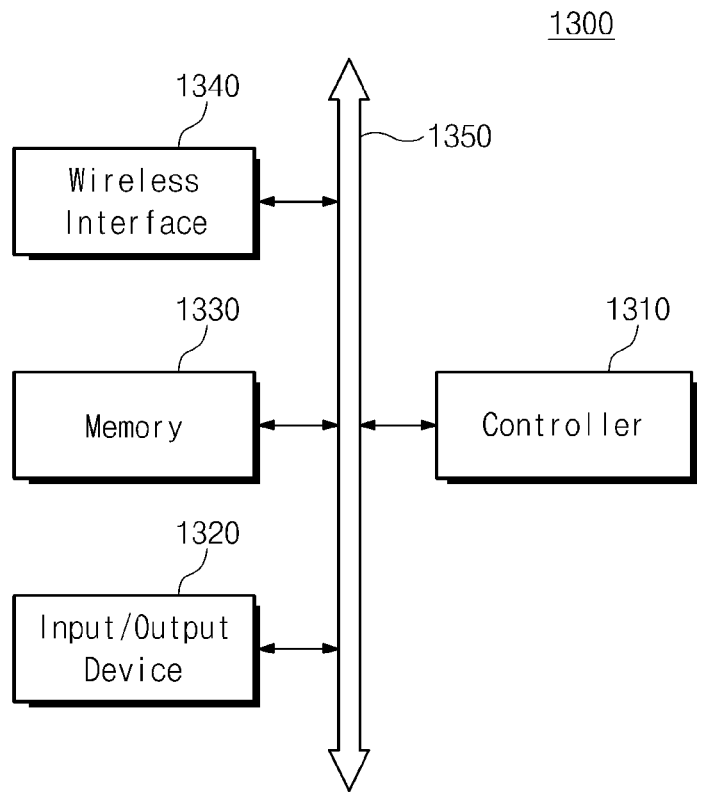
FIGS. 11 and 12 are schematic block diagrams illustrating electronic devices including the semiconductor device according to example embodiments disclosed herein.
Figure 12:
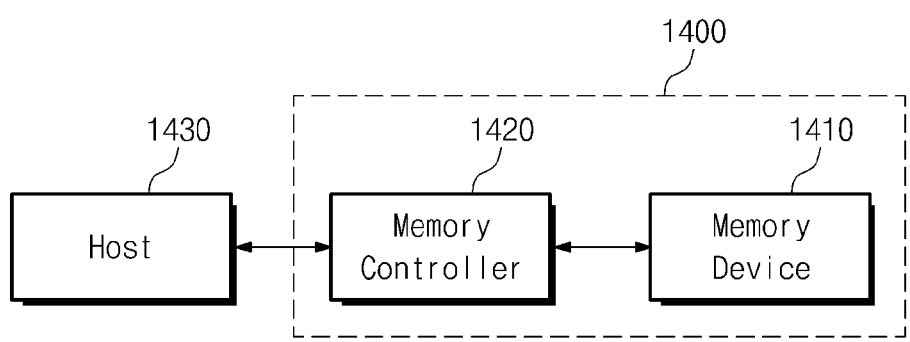

FIGS. 11 and 12 are schematic block diagrams illustrating electronic devices including the semiconductor device according to example embodiments disclosed herein.

Referring to FIG. 11, an electronic device 1300 including a semiconductor device according to example embodiments disclosed herein may be used in one of a personal digital assistant (PDA), a laptop computer, a mobile computer, a web tablet, a wireless phone, a cell phone, a digital music player, a wired or wireless electronic device, or a complex electronic device including a combination of such functionalities. The electronic device 1300 may include a controller 1310, an input/output device(s) 1320 (such as a keypad, a keyboard, a display, etc.), a memory 1330, and/or a wireless interface 1340 that are connected/coupled to each other through a bus 1350. The controller 1310 may include, for example, at least one of a microprocessor, a digital signal process, a microcontroller, and the like. The memory 1330 may be configured to store a command code to be used by the controller 1310 and/or user data. The memory 1330 may include a semiconductor device according to example embodiments disclosed herein. The electronic device 1300 may use a wireless interface 1340 configured to transmit data to and/or receive data from a wireless communication network using a RF (radio frequency) signal. For example, the wireless interface 1340 may include, for example, an antenna, a wireless transceiver, and so forth. The electronic system 1300 may be used in a communication interface protocol of a communication system according to a standard such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 12, a memory system including a semiconductor device according to example embodiments disclosed herein will be described. The memory system 1400 may include a memory device 1410 for storing relatively large quantities of data and a memory controller 1420. The memory controller 1420 controls the memory device 1410 to read data stored in the memory device 1410 and/or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments disclosed herein.

The semiconductor memory devices disclosed above may be encapsulated using various and diverse packaging techniques. For example, semiconductor memory devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

According to example embodiments, a magnetic memory device may comprise a first magnetic structure comprising a first surface, a second magnetic structure comprising a second surface, and a tunnel barrier between the first surface of the first magnetic structure and the second surface of the second magnetic structure. At least one of the first magnetic structure or the second magnetic structure comprises a perpendicular magnetic layer, and a polarization enhancement layer interposed between the tunnel barrier and the perpendicular magnetic layer in which the polarization enhancement layer comprises cobalt, iron, and at least one of the elements of Group IV. The polarization enhancement layer comprises a magnetization direction that is perpendicular to or substantially perpendicular to at least one of the first surface and the second surface.

According to example embodiments, a magnetic memory device may comprise a first magnetic structure comprising a first surface, a second magnetic structure comprising a second surface, and a tunnel barrier between the first and second magnetic structures. At least one of the first and second magnetic structures comprises a polarization enhancement layer in direct contact with the tunnel barrier in which the polarization enhancement layer comprises cobalt, iron, and at least one of the elements of Group IV. The polarization enhancement layer comprises a magnetization direction perpendicular to or substantially perpendicular to at least one of the first surface and the second surface.

According to example embodiments, a magnetic memory device may comprises an address decoder to decode a received address information signal and output an address select signal, and a memory array comprising a plurality of memory cells in which the memory array is responsive to the address select signal to select one or more memory cells corresponding to the address select signal. At least one memory cell may comprise a first magnetic structure comprising a first surface, a second magnetic structure comprising a second surface, and a tunnel barrier between the first and second magnetic structures. At least one of the first and second magnetic structures may comprise a polarization enhancement layer in direct contact with the tunnel barrier in which the polarization enhancement layer comprises cobalt, iron, and at least one of the elements of Group IV. The polarization enhancement layer comprises a magnetization direction that is perpendicular to or substantially perpendicular to at least one of the first surface and the second surface.

According to example embodiments, a magnetic memory device may comprises an address decoder to decode a received address information signal and output an address select signal, and a memory array comprising a plurality of memory cells in which the memory array is responsive to the address select signal to select one or more memory cells corresponding to the address select signal. At least one memory cell may comprise a first magnetic structure comprising a first surface, a second magnetic structure comprising a second surface, and a tunnel barrier between the first and second magnetic structures. At least one of the first and second magnetic structures may comprise a polarization enhancement layer in direct contact with the tunnel barrier in which the polarization enhancement layer comprises cobalt, iron, and at least one of the elements of Group IV. The polarization enhancement layer comprises a magnetization direction that is perpendicular to or substantially perpendicular to at least one of the first surface and the second surface.

According to example embodiments, a magnetic memory device may comprise a first magnetic structure, a second magnetic structure, and a tunnel barrier interposed between the first magnetic structure and the second magnetic structure in which the first magnetic structure, the second magnetic structure and the tunnel barrier are aligned substantially in a first direction. At least one of the first magnetic structure and the second magnetic structure may comprise a perpendicular magnetic layer, and a polarization enhancement layer interposed between the tunnel barrier and the perpendicular magnetic layer in which the polarization enhancement layer comprising cobalt, iron, and at least one of the elements of Group IV. The polarization enhancement layer comprises a magnetization direction that is substantially parallel to or substantially anti-parallel to the first direction.

According to example embodiments, a magnetic memory device may comprise a first magnetic structure, a second magnetic structure, and a tunnel barrier interposed between the first magnetic structure and the second magnetic structure in which the first magnetic structure, the second magnetic structure and the tunnel barrier are aligned substantially in a first direction. At least one of the first and second magnetic structures may comprise a polarization enhancement layer in direct contact with the tunnel barrier in which the polarization enhancement layer comprises cobalt, iron, and at least one of the elements of Group IV. The polarization enhancement layer comprises a magnetization direction that is substantially parallel to or substantially anti-parallel to the first direction.

While example embodiments have been particularly shown and described, it will be understood by one of ordinary skill in the art that variations in form and detail may be made therein without departing from the scope of the attached claims.

What is claimed is:

1. A magnetic memory device, comprising:
a first magnetic structure comprising a first surface;
a second magnetic structure comprising a second surface; and
a tunnel barrier between the first surface of the first magnetic structure and the second surface of the second magnetic structure,
wherein at least one of the first magnetic structure and the second magnetic structure comprises:
a perpendicular magnetic layer; and
a polarization enhancement layer interposed between the tunnel barrier and the perpendicular magnetic layer, the polarization enhancement layer comprising a CoFeC layer having a crystalline structure with a (100) crystal plane that is parallel to or substantially parallel to a (100) crystal plane of the tunnel barrier, and
wherein the polarization enhancement layer comprises a magnetization direction that is perpendicular to or substantially perpendicular to at least one of the first surface and the second surface.

2. The device of claim 1, wherein the polarization enhancement layer comprises $(Co_xFe_{100-x})_{100-z}C_z$, wherein x ranges from 0% to 50% and z ranges from 2% to 8%.

3. The device of claim 1, wherein the polarization enhancement layer comprises a tetragonally-distorted crystal structure.

4. The device of claim 1, wherein at least one of the first and second magnetic structures further comprises an exchange coupling layer between the polarization enhancement layer and the perpendicular magnetic layer.

5. The device of claim 4, wherein the perpendicular magnetic layer comprises at least one magnetic layer having a magnetization direction that is switchable between at least two directions that are perpendicular to or substantially perpendicular to at least one of the first and second surfaces, and
wherein the magnetization direction of the polarization enhancement layer is switchable to be parallel to or substantially parallel to the magnetization direction of the perpendicular magnetic layer.

6. The device of claim 5, wherein the tunnel barrier comprises a surface,
magnetic memory device further comprising a first electrode spaced apart from the tunnel barrier in which the first magnetic structure is interposed therebetween,
wherein the first magnetic structure comprises the polarization enhancement layer, the exchange coupling layer, the perpendicular magnetic layer, and an upper non-magnetic layer between the perpendicular magnetic layer and the first electrode,
wherein the polarization enhancement layer is in direct contact with the surface of the tunnel barrier, and
wherein the upper non-magnetic layer comprises a same material as the tunnel barrier.

7. The device of claim 5, wherein the tunnel barrier comprises a surface,
magnetic memory device further comprising a second electrode between the substrate and the second magnetic structure,
wherein the second magnetic structure comprises the polarization enhancement layer, the exchange coupling layer, the perpendicular magnetic layer, and a non-magnetic metal layer between the polarization enhancement layer and the exchange coupling layer, and
wherein the polarization enhancement layer is in direct contact with the surface of the tunnel barrier.

8. A magnetic memory device, comprising:
a first magnetic structure comprising a first surface;
a second magnetic structure comprising a second surface; and
a tunnel barrier between the first surface of the first magnetic structure and the second surface of the second magnetic structure,
wherein at least one of the first and second magnetic structures comprises:
a polarization enhancement layer in direct contact with the tunnel barrier, the polarization enhancement layer comprising a CoFeC layer having a crystalline structure with a (100) crystal plane that is parallel to or substantially parallel to a (100) crystal plane of the tunnel barrier,
wherein the polarization enhancement layer comprises a crystalline structure such that a lattice-matching is formed at an interface between the polarization enhancement layer and the tunnel barrier, and
wherein the CoFeC layer comprises a magnetization direction perpendicular to or substantially perpendicular to at least one of the first surface and the second surface.

9. The device of claim 8, wherein at least one of the first and second magnetic structures further comprises a perpendicular magnetic layer that is spaced apart from the tunnel barrier in which the polarization enhancement layer is interposed therebetween, and
wherein the perpendicular magnetic layer comprises a magnetization direction that is perpendicular to or substantially perpendicular to at least one of the first surface and the second surface.

10. The device of claim 9, wherein the magnetization direction of the polarization enhancement layer is a same magnetization direction or substantially the same magnetization direction as the magnetization direction of the perpendicular magnetic layer.

11. The device of claim 10, wherein the polarization enhancement layer and the perpendicular magnetic layer are configured so that the magnetization directions thereof are fixed in a direction perpendicular to or substantially perpendicular to at least one of the first surface and the second surface.

12. The device of claim 10, wherein the polarization enhancement layer and the perpendicular magnetic layer are configured so that the magnetization directions thereof are switchable.

13. A magnetic memory device, comprising:
a first magnetic structure;
a second magnetic structure; and
a tunnel barrier interposed between the first magnetic structure and the second magnetic structure, the first magnetic structure, the second magnetic structure and the tunnel barrier being aligned substantially in a first direction,
wherein at least one of the first magnetic structure and the second magnetic structure comprises:
a perpendicular magnetic layer; and
a polarization enhancement layer interposed between the tunnel barrier and the perpendicular magnetic layer, the polarization enhancement layer comprising cobalt, iron, and carbon, and comprising a tetragonally distorted crystal structure with a (100) crystal plane that is parallel to or substantially parallel to a (100) crystal plane of the tunnel barrier, and
wherein the polarization enhancement layer comprises a magnetization direction that is substantially parallel to or substantially anti-parallel to the first direction.

14. The device of claim 13, wherein the polarization enhancement layer comprises $(Co_xFe_{100-x})_{100-z}C_z$, wherein x ranges from 0% to 50% and z ranges from 2% to 8%.

15. The device of claim 13, wherein the polarization enhancement layer comprises $(Co_xFe_{100-x})_{100-z-a}C_zB_a$, wherein x ranges from 0% to 50% and z+a ranges from 2% to 8%.

16. The device of claim 13, wherein the perpendicular magnetic layer comprises at least one magnetic layer having a magnetization direction that is switchable between at least two directions that are substantially parallel to or substantially anti-parallel to the first direction, and
wherein the magnetization direction of the polarization enhancement layer is switchable to be parallel to or substantially parallel to the magnetization direction of the perpendicular magnetic layer.

17. The device of claim 16, wherein the tunnel barrier comprises a surface,
magnetic memory device further comprising a first electrode spaced apart from the tunnel barrier in which the first magnetic structure is interposed therebetween,
wherein the first magnetic structure comprises the polarization enhancement layer, an exchange coupling layer, the perpendicular magnetic layer, and an upper non-magnetic layer between the perpendicular magnetic layer and the first electrode,
wherein the polarization enhancement layer is in direct contact with the surface of the tunnel barrier, and
wherein the upper non-magnetic layer comprises a same material as the tunnel barrier.

18. The device of claim 16, wherein the tunnel barrier comprises a surface,
magnetic memory device further comprising a second electrode between the substrate and the second magnetic structure,
wherein the second magnetic structure comprises the polarization enhancement layer, an exchange coupling layer, the perpendicular magnetic layer, and a non-magnetic metal layer between the polarization enhancement layer and the exchange coupling layer, and
wherein the polarization enhancement layer is in direct contact with the surface of the tunnel barrier.

* * * * *